(12) United States Patent
Yu et al.

(10) Patent No.: US 8,259,508 B2
(45) Date of Patent: *Sep. 4, 2012

(54) ERASE OPERATION CONTROL SEQUENCING APPARATUS, SYSTEMS, AND METHODS

(75) Inventors: Xiaojun Yu, Beacon, NY (US); Jin-man Han, San Jose, CA (US); Aaron Yip, Santa Clara, CA (US)

(73) Assignee: Micron Technology, Inc., Boise, ID (US)

( * ) Notice: Subject to any disclaimer, the term of this patent is extended or adjusted under 35 U.S.C. 154(b) by 89 days.

This patent is subject to a terminal disclaimer.

(21) Appl. No.: 12/847,744

(22) Filed: Jul. 30, 2010

(65) Prior Publication Data

US 2010/0296348 A1 Nov. 25, 2010

Related U.S. Application Data

(63) Continuation of application No. 11/657,949, filed on Jan. 25, 2007, now Pat. No. 7,778,086.

(51) Int. Cl.
*G11C 16/16* (2006.01)
*G11C 16/14* (2006.01)
*G11C 16/10* (2006.01)
*G11C 16/32* (2006.01)
*G11C 16/08* (2006.01)
*G11C 16/06* (2006.01)

(52) U.S. Cl. ......... 365/185.29; 365/185.13; 365/185.17; 365/185.18; 365/185.27; 365/185.33; 365/185.23

(58) Field of Classification Search ............. 365/185.13, 365/185.17, 185.18, 185.27, 185.29, 185.23, 365/185.33
See application file for complete search history.

(56) References Cited

U.S. PATENT DOCUMENTS

| | | |
|---|---|---|
| 5,978,270 A | 11/1999 | Tanaka et al. |
| 6,240,017 B1 | 5/2001 | Le et al. |
| 6,262,926 B1 * | 7/2001 | Nakai ........................... 365/200 |
| 6,621,735 B2 * | 9/2003 | Nakamura et al. ........ 365/185.17 |
| 7,035,143 B2 | 4/2006 | Lee |
| 7,068,543 B2 | 6/2006 | Mihnea et al. |
| 7,778,086 B2 | 8/2010 | Yu et al. |
| 2005/0018489 A1 * | 1/2005 | Hosono .................... 365/185.29 |
| 2006/0221708 A1 | 10/2006 | Higashitani |
| 2008/0181020 A1 | 7/2008 | Yu et al. |

OTHER PUBLICATIONS

Dimaria, D. J., et al., "Impact ionization, trap creation, degradation, and breakdown in silicon dioxide films on silicon", J. Appl. Phys., 73(7), (1993), 3367-3384.

* cited by examiner

*Primary Examiner* — J. H. Hur
(74) *Attorney, Agent, or Firm* — Schwegman Lundberg & Woessner, P.A.

(57) ABSTRACT

Apparatus, systems, and methods may operate to receive an external erase command at a control circuit coupled to an erasable memory array located on a substrate. A global select gate voltage may thereafter be enabled for application to wordline transistors coupled to the erasable memory array after a voltage applied to the substrate has reached a preselected initiation voltage level between about zero volts and an ultimate erase voltage.

20 Claims, 5 Drawing Sheets

ERASE OPERATION CONTROL SEQUENCING APPARATUS, SYSTEMS, AND METHODS

CLAIM OF PRIORITY

This application is a continuation of and claims the benefit of priority under 35 U.S.C. §120 to U.S. patent application Ser. No. 11/657,949 filed on Jan. 25, 2007, now U.S. Pat. No. 7,778,086 which is hereby incorporated by reference herein in its entirety.

TECHNICAL FIELD

Various embodiments described herein relate to apparatus, systems, and methods associated with information storage and processing, including the operation and manufacture of memories having volatile and non-volatile storage.

BACKGROUND INFORMATION

Continuously reducing the size of solid-state memory architecture is an effective way to increase the capacity of such memories for a given amount of circuit real estate. However, the resulting feature size can give rise to design and process challenges. For example, voltages impressed on conductors located close together can provide a strong electric field that contributes to the breakdown of thin dielectric layers. This may become especially significant during erase and program operations.

For example, considering programming operations for some memory structures, the difference in potential between wordline conductors and global source-select-gate (global SGS) or global drain-select-gate (global SGD) conductors may be less than 20V, and the SGS bias can be trimmed to further reduce this amount.

As a matter of contrast, during an erase operation, the difference between wordlines and global SGS/SGD conductors may reach ~24V. This is because the pass gate for string drivers may be biased to +4V (Vpass) and higher in order to fully discharge the wordlines. To prevent the discharge of select gates, the global SGS/SGD conductors are biased to the same voltage as Vpass. After a nominal settling time, the array substrate voltage (Iso-Pwell) rises to about 20V for erase, which couples the local SGS and SGD conductors to about −24V. Thus, the wordlines are at about zero volts, while the local SGD/SGS conductors are at 24V.

Therefore, the dielectric stress in semiconductor memory may be more severe during erase operations than for programming operations, and the possibility of dielectric breakdown between two polysilicon conductors increases, since the electrical field is about 4.8 MV/cm (for 50 nm technology) and 6.86 MV/cm (for 35 nm technology), assuming the conductor spacing is about the same as the feature size. These field values are both close to the silicon dioxide breakdown voltage quoted in various references. The possibility of breakdown further increases with the stress time, which may be several milliseconds for erase operations. Thus, there is a need for apparatus, systems, and methods that provide a mechanism to reduce the dielectric stress encountered during memory erase operations. Readers interesting in learning more about the interaction between wordlines and gate-select lines are encouraged to consult U.S. Pat. Nos. 7,035,143 and 7,068,543, incorporated herein by reference in their entirety.

DETAILED DESCRIPTION

To address the challenges described above, various embodiments described herein may operate to provide a revised control sequence for select-gate array lines during erase operations. For example, global select-gates may be grounded at the initial stage of erase operations, and only after $V_{ISO-PWELL}$ rises to a preselected initiation voltage ($V_I$), are the select-gates driven to Vo. In this manner, the local select gates are coupled to a lower voltage and, depending on the ultimate magnitude of $V_{ISO-PWELL}$, the local select-gate voltage may be controlled so that select-gates and wordlines are stressed no more than during programming operations.

Figure 1A:
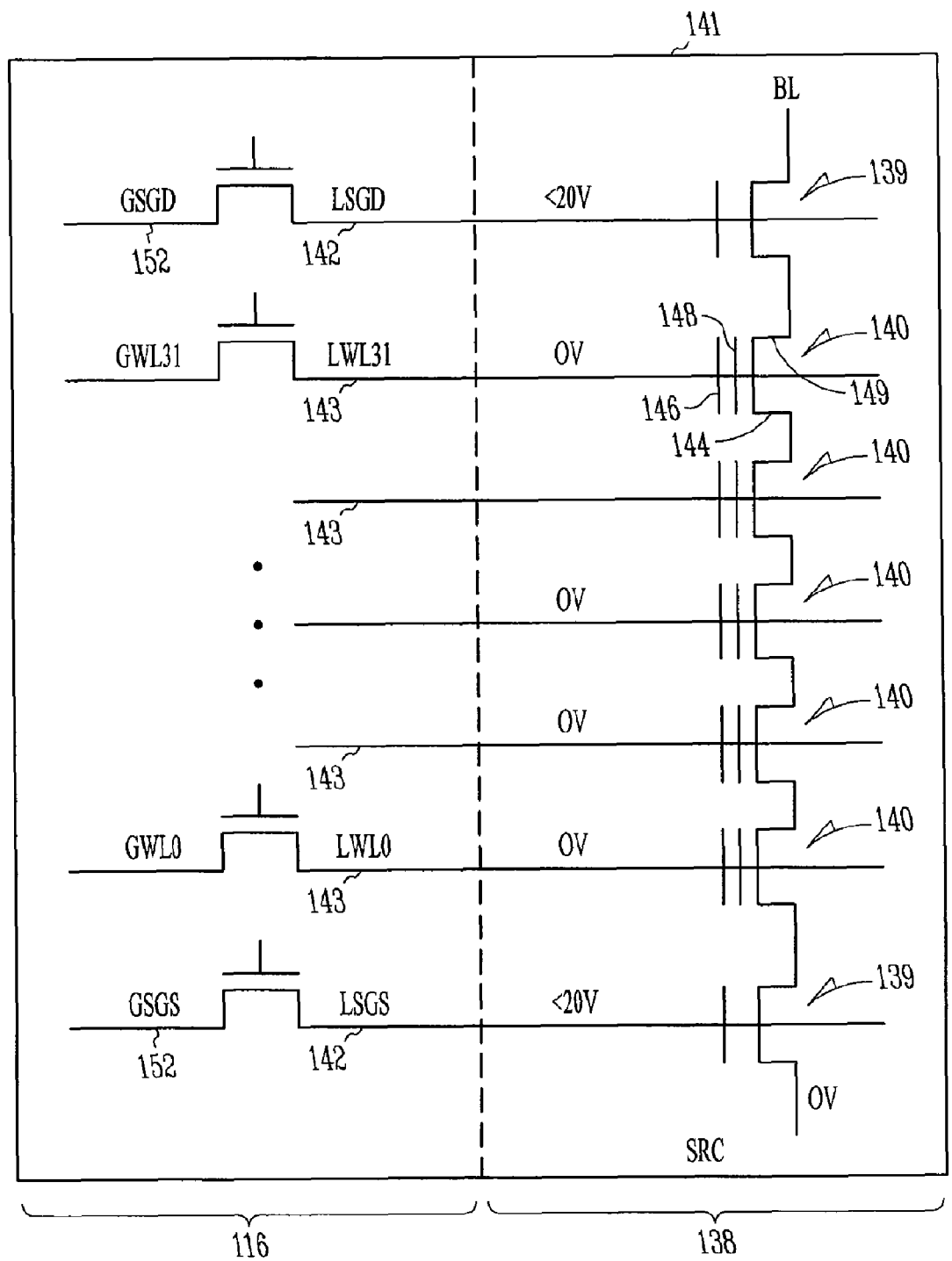
FIG. 1A is a schematic diagram of a bitline string of memory cells during erase operations conducted according to various embodiments of the invention.

FIG. 1A is a schematic diagram of a bitline string 138 of memory cells 140 during erase operations conducted according to various embodiments of the invention. The bitline string 138 may include switches 139 to permit current to flow through the bitline string 138. The switches 139 may be coupled to local select-gates (SGD/SGS) signal lines 142.

Figure 1B:
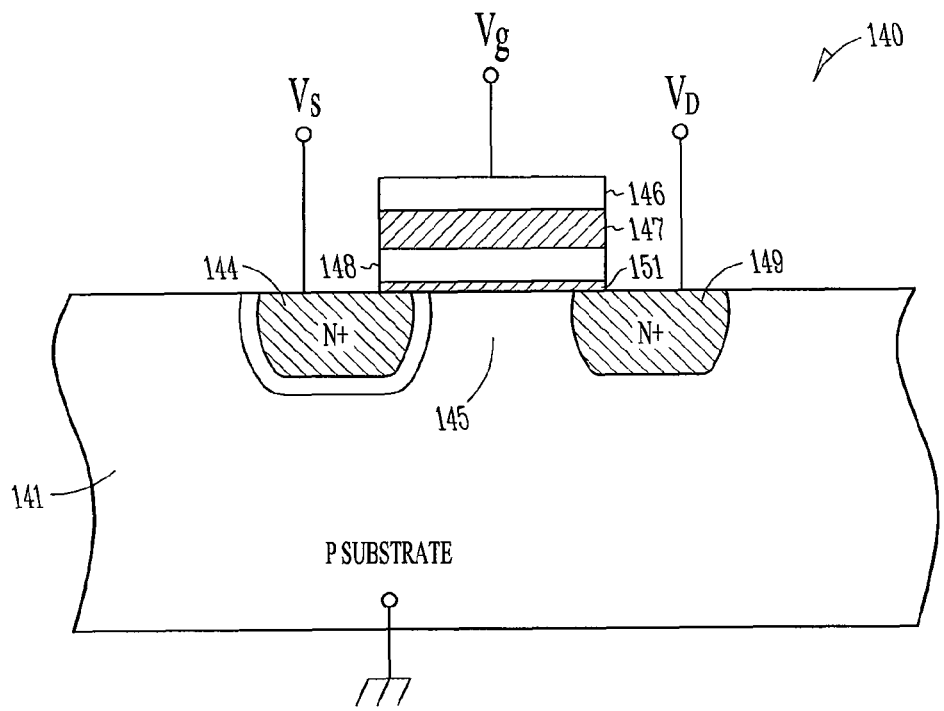
FIG. 1B is a side, cut-away view of a flash memory cell according to various embodiments of the invention.

FIG. 1B is a side, cut-away view of a flash memory cell according to various embodiments of the invention. Referring now to FIGS. 1A and 1B, it can be seen that the bitline string 138 may include a number of memory cells 140. In FIG. 1A, a plurality of NAND flash memory cells 140 are shown. Each of the cells 140 may include a substrate 141, a source 144, a p type channel 145, a control gate 146 (e.g., coupled to a local wordline 143), a floating gate 148 electrically isolated by an insulating layer 147 of silicon dioxide $SiO_2$ and a thin tunnel oxide 151, and a drain 149. As described herein, the cells 140 are essentially n-channel transistors with the addition of a floating gate 148. Electrical access to the floating gate 148 takes place through a network of surrounding $SiO_2$ layers and the source 144, drain 149, channel 145, and control gate 146. Charge present on the floating gate 148 is retained due to the energy barrier height of the $SiO_2$, leading to the non-volatile nature of the memory cell 140.

Programming a flash memory cell 140 means that charge (i.e., electrons) is added to the floating gate 148. A high drain to source bias voltage is applied, along with a high control gate voltage. The gate voltage inverts the channel 145, while the drain bias accelerates electrons towards the drain 149. In the process of crossing the channel 145, some electrons will experience a collision with the silicon lattice and become redirected towards the $SiO_2$ interface. With the aid of the field produced by the gate voltage, some of these electrons will travel across the oxide 151 and become added to the floating gate 148. After programming is completed, the electrons added to the floating gate 148 increase the cell's threshold voltage. Programming is a selective operation, performed on each individual cell 140.

Erasing a flash cell 140 means that electrons (i.e., charge) are removed from the floating gate 148. Erasing flash memory is performed by applying electrical voltages to many cells at once so that the cells are erased in a "flash." A typical erase operation in a flash memory may be performed by applying a positive voltage to the source 144, a negative or a ground voltage to the control gate 146, and holding the substrate 141 of the memory cells 140 at ground. The drain 149 is allowed to float. Under these conditions, a high electric field (8-10 MV/cm) is present between the floating gate 148 and the source 144. The source junction experiences a gated-diode condition during erase operations, and electrons that manage to tunnel through the first few angstroms of the $SiO_2$ interface oxide 151 are then swept into the source 144. After the erase operation has been completed, electrons have been removed from the floating gate 148, reducing the cell threshold voltage Vt. While programming is selective to each individual cell, erasing is not, with many cells being erased simultaneously.

As described above, the global select-gate (GSGD/GSGS) signal lines 152 during conventional erase operations are biased to a certain voltage (gate-select bias voltage Vo≈+4-5V relative to ground) before the array substrate voltage ($V_{ISO-PWELL}$) rises to about 20V. After $V_{ISO-PWELL}$ reaches this value, the local select-gate signal lines (LSGD/LSGS) 142 are coupled to a total of about 20V+Vo, while adjacent wordlines are grounded, resulting in about a 24V difference between the local select-gate signal lines 142 and adjacent wordlines 143. The voltage $V_{ISO-PWELL}$ as used herein refers to the bias existing across the iso-n-FET (field effect transistor) p-well in a memory array substrate.

Dielectric breakdown is most likely to occur under conditions where two conductors (metal or polysilicon) are closely-spaced while carrying widely varying voltages, such as 24V and zero volts, or ground. Thus, the most promising conditions for breakdown occur inside the memory array, where conductor spacing is reduced to increase the array density and the appearance of a strong electric field is likely.

The embodiments described herein provide a new control sequence for select-gate array lines during erase operations. In various embodiments, select-gates are grounded at the initial stage of erase operations. After $V_{ISO-PWELL}$ rises to a preselected initiation voltage ($V_I$), which may be about 3-4V, the global select-gate signal lines 152 can be driven to Vo, so that the local select gate signal lines 142 are coupled to about 20V+Vo−$V_{ISO-PWELL}$. Depending on the ultimate magnitude of $V_{ISO-PWELL}$, the local select-gate signal line voltage may be controlled to <20V, as shown in FIG. 1A, such that the select-gate signal lines 142 and local wordlines 143 are stressed no more than during programming operations.

Figure 1C:
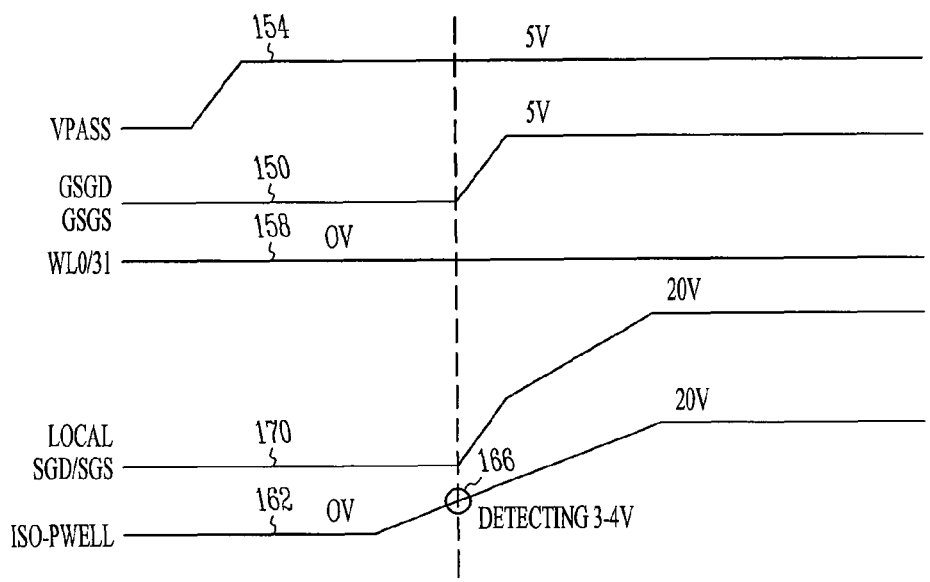
FIG. 1C is a signal diagram illustrating relative amplitudes of bitline voltages during erase operations conducted according to various embodiments of the invention.

FIG. 1C is a signal diagram illustrating relative amplitudes of bitline voltages during erase operations conducted according to various embodiments of the invention. As can be seen, the global SGD and SGS signals 150 (corresponding to signals on the GSGD/GSGS lines 152 of FIG. 1A) are grounded initially during erase operations (e.g., after an external "erase" command has been received). The Vpass signal 154 and the wordline signals 158 (corresponding to the signals on the local wordlines 143 of FIG. 1A) are settled before the substrate voltage $V_{ISO-PWELL}$ 162 begins to rise. After the voltage $V_{ISO-PWELL}$ 162 rises to some selected initiation voltage point 166, perhaps as detected by a substrate voltage detection circuit (e.g., see element 234 as described below and shown in FIG. 2), the global SGD/SGS signal lines are driven to the same voltage as Vpass (about 5V). The rise time for the voltage impressed on the local SGD/SGS signals 170 (corresponding to the signals on the LSGD/LSGS signal lines 142 in FIG. 1A) is relatively fast compared with the rise time of the substrate voltage $V_{ISO-PWELL}$ 162. Thus, the local SGD/SGS signals 170 rise to about 4V while the substrate voltage $V_{ISO-PWELL}$ 162 continues to ramp up.

Eventually, the local SGD/SGS signals 170 are coupled up to a voltage less than the final voltage of the substrate voltage $V_{ISO-PWELL}$ 162. Thus, the voltage difference between the local SGD/SGS signals 170 and the wordline signals 158, in this case, can be effectively reduced, and stress conditions encountered by these conductors may be comparable to those imposed by programming operations.

In most embodiments, the substrate voltage detection circuit operates only after the substrate voltage $V_{ISO-PWELL}$ 162 begins to rise and is shut off after detection activity is finished. In this way, the detection circuit consumes less power and has little or no effect on the rise time of the voltage $V_{ISO-PWELL}$ 162.

Figure 2:
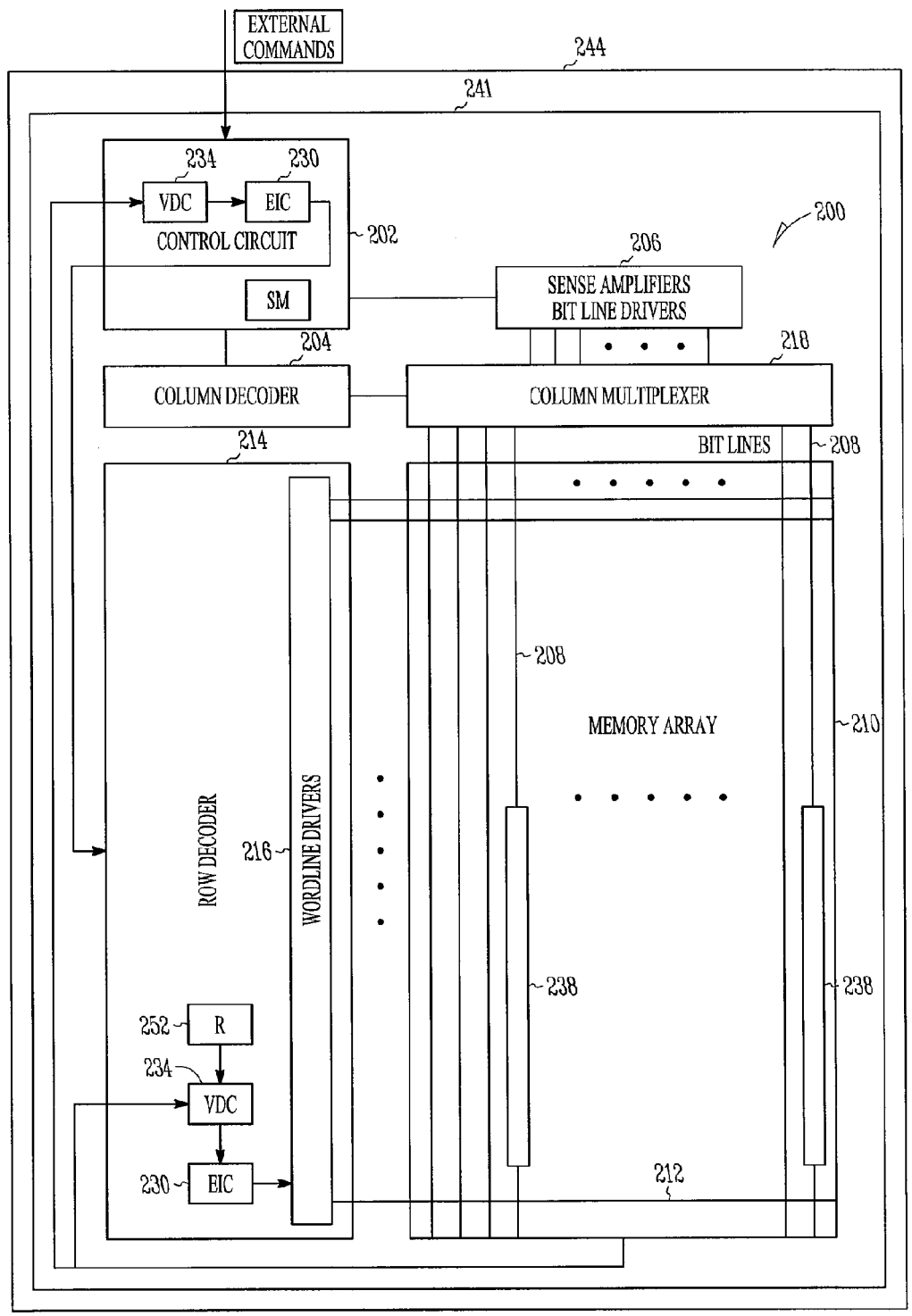
FIG. 2 is a block diagram of an apparatus according to various embodiments of the invention.

FIG. 2 is a block diagram of an apparatus 200 according to various embodiments of the invention. The apparatus 200 may comprise a flash memory which includes a control circuit 202 for controlling the operations of the memory such as reading, writing, and erasing. The apparatus 200 may also include a column decoder 204, sense amplifiers/bitline drivers 206, bitlines 208 including the bitline strings 238 (similar to or identical to the bitline strings 138 of FIG. 1A), wordlines 212, a row decoder 214 with wordline drivers 216 (similar to or identical to the wordline drivers 116 of FIG. 1A) that can be coupled to the wordlines and gate-select lines in the bitline strings 238, and a column multiplexer 218.

The apparatus 200 may further comprise a memory array 210, such as an erasable memory array, formed as a portion of a substrate 241, which may be similar to or identical to the substrate 141 of FIG. 1A. Thus, the memory array 210 may comprise a plurality of transistors controlled by floating gates, similar to or identical to the type shown in FIG. 1B. The apparatus 200 may also comprise an erase initiation circuit 230 to enable application of a global select gate voltage to wordline transistors (e.g., included in the wordline drivers 216) coupled to the erasable memory array 210 after a voltage applied to the substrate 241 has reached a preselected initiation level between about zero volts and the ultimate erase voltage (Verase).

Some embodiments of the apparatus 200 may include a semiconductor memory comprising a semiconductor memory package 244, such as a thin small outline package (TSOP), a multi-chip package (MCP), or a package-on-package (PoP), that can be used to house the substrate 241. That is, the substrate 241 and memory array 210 may be disposed within the semiconductor memory package 244. Such packages are known to those of ordinary skill in the art, and can be obtained from Micron Technology, Inc.

The control circuit 202 may operate to receive external commands, including external erase commands. The control circuit 202 may be coupled to the erasable memory array 210 via a decoder circuit 214, such as a row decoder circuit. The erase initiation circuit 230 may be included in the control circuit 202, the decoder circuit 214, or some other element of the apparatus 200.

In some embodiments, the apparatus 200 comprises a voltage detection circuit 234 to detect the voltage applied to the substrate 241. The voltage detection circuit 234 may be used to provide an indication to the erase initiation circuit 230 that the voltage $V_{ISO-PWELL}$ applied to the substrate 241 has reached the preselected initiation voltage level $V_I$. The voltage detection circuit 234 may be coupled to a reference 252 indicating the preselected initiation voltage level.

The erase initiation circuit 230 and the voltage detection circuit 234 may form a portion of the control circuit 202, the row decoder 214, or any other element of the apparatus 200. The erase initiation circuit 230 and the voltage detection circuit 234 may form a portion of the same element (e.g., both located in the control circuit 202), or of different elements (e.g., the erase initiation circuit 230 included in the control circuit 202, and the voltage detection circuit 234 included in the row decoder, or vice versa).

The voltage detection circuit 234 may be coupled to the erase initiation circuit 230, so that, after the erase initiation circuit 230 receives an indication that the initiation voltage has been reached by the substrate 241, application of the select-gate voltage to the switches (e.g., switches 139 shown in FIG. 1A) is enabled.

In some embodiments, the substrate voltage detection circuit is operative only during the erase operation. Thus, the control circuit 202 may include a state machine SM to provide an indication that the operational mode is an "erase" mode, and when this occurs, the indication (e.g., a flag or voltage logic signal) may be used to enable the voltage detection logic, including the voltage detection circuit 234. As noted previously, the voltage detection circuit 234 may be included in the control circuit 202 that receives external erase commands and is coupled to a decoder circuit 214. The voltage detection circuit 234 may also be included in the decoder circuit 214, coupled to the erasable memory array 210.

The preselected initiation voltage $V_I$ may be between about 3V and 5V in some embodiments, and about 3.7V in some embodiments. In many embodiments, the initiation voltage magnitude is less than about one-third of the ultimate magnitude of Verase. If the initiation voltage $V_I$ is too high, the applied select gate voltage may not have enough time to ramp up, and ultimately be too low to properly erase the memory cells in the bitline strings 238. If the initiation voltage $V_I$ is too low, then the applied gate select voltage may have too much time to ramp up, becoming too high, stressing the switches in the bitline strings 238.

Once an erase command is received by the control circuit 202, the voltage Vpass is applied to enable transferring voltages on the global gate select lines GSGD/GSGS to the local gate select lines SGD/SGS. However, initially, the global gate select lines are held at ground (instead of being allowed to ramp up). At about the same time, the voltage detection circuit 234 is enabled and the substrate voltage $V_{ISO-PWELL}$ begins to rise.

When the voltage detection circuit 234 detects that the substrate voltage $V_{ISO-PWELL}$ has reached the preselected initiation voltage $V_I$, the global gate select voltage ramp-up is enabled and no longer held at ground potential. While the global gate select voltage may stop increasing when it reaches about five volts, the local gate select voltage may continue ramping upward until the ultimate target voltage is reached, perhaps substantially equal to the desired erase voltage, or Verase. Thus, by holding the global gate select lines at a lower potential for some amount of time, the coupling ratio between the $V_{ISO-PWELL}$ and the local gate select lines may be substantially reduced.

Many structural variations are possible. For example, the memory array 210 may comprise an erasable flash memory array, including a NAND flash memory array. The substrate may comprise a p-well diffusion that includes wordline transistors in the wordline drivers 216.

Figure 3:
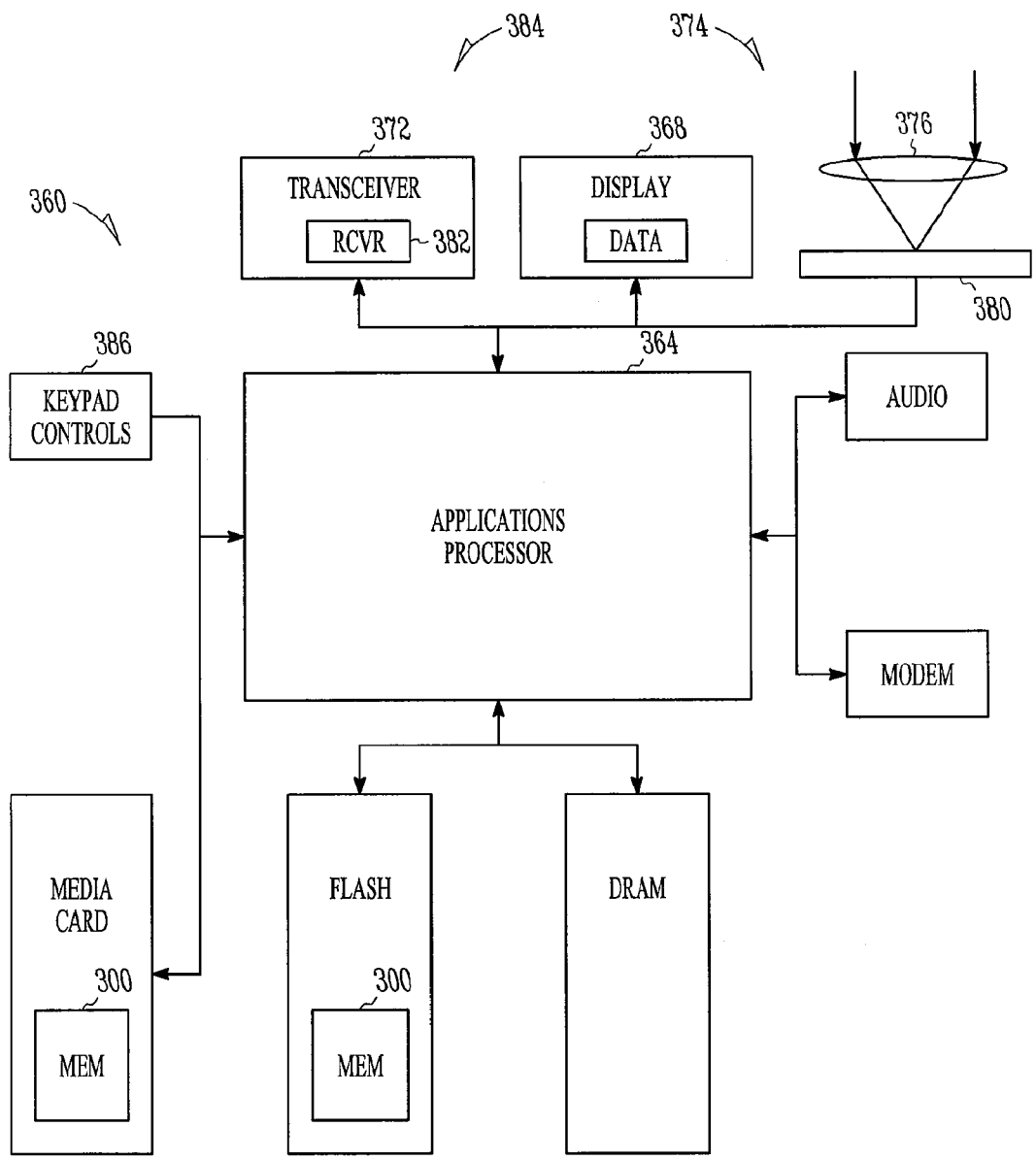
FIG. 3 is a block diagram of a system according to various embodiments of the invention.

FIG. 3 is a block diagram of a system 360 according to various embodiments of the invention. The system 360 may include one or more apparatus 300, which may be similar to or identical to the apparatus 200 shown in FIG. 2.

The system 360, in some embodiments, may comprise a processor 364 coupled to a display 368 and/or a wireless transceiver 372. Erasable memory array(s) included in the apparatus 300 may also be operatively coupled to the processor 364. Thus, the processor 364 may issue external commands, such as external erase commands, to be received and processed by control circuitry in the apparatus 300. The display 368 may be used to display data, which may be received by the wireless transceiver 372, and stored in the erasable memory array(s) of the apparatus 300.

In some embodiments, the system 360 may comprise a camera 374, including a lens 376 and an imaging plane 380 to couple to the processor 364. The imaging plane 380 may be used to receive light captured by the lens 376.

Many variations are possible. For example, in some embodiments, the system 360 may comprise a cellular telephone receiver 382 forming a portion of the wireless transceiver 372. The cellular telephone receiver 382 may also receive data to be processed by the processor 364, and displayed on the display 368. In some embodiments, the system 360 may comprise an audio, video, or multi-media player 384, including a set of media playback controls 386 to couple to the processor 364.

Any of the components previously described may be implemented in a number of ways, including embodiments in software. Software embodiments may be used in a simulation system, and the output of such a system may be used to operate various portions of the apparatus 200, 300, and the systems 360 described herein.

Thus, the wordline drivers 116, 216; bitline strings 138, 238; switches 139; memory cells 140; substrates 141, 241; local select-gate signal lines (LSGD/LSGS) 142; local wordlines 143; source 144; control gate 146; floating gate 148; drain 149; global SGD/SGS signals 150; global select-gate signal lines (GSGD/GSGS)152; Vpass signal 154; wordline signals 158; voltage $V_{ISO-PWELL}$ 162; initiation voltage point 166; local SGD/SGS signals 170; apparatus 200, 300; control circuit 202; column decoder 204; sense amplifiers/bitline drivers 206; bitlines 208; memory array 210; wordlines 212; row decoder 214; column multiplexer 218; erase initiation circuit 230; voltage detection circuit 234; system 360; processor 364; display 368; wireless transceiver 372; camera 374; lens 376; imaging plane 380; cellular telephone receiver 382; player 384; playback controls 386; and erase voltage Verase may all be characterized as "modules" herein.

The modules may include hardware circuitry, optical components, single or multi-processor circuits, memory circuits, software program modules and objects, firmware, and combinations thereof, as desired by the architect of the apparatus 200, 300 and the systems 360, and as appropriate for particular implementations of various embodiments.

The apparatus and systems of various embodiments may be useful in applications other than erasing a NAND flash memory array, and thus, the various embodiments are not to be so limited. The illustrations of the apparatus 200, 300 and the systems 360 are intended to provide a general understanding of the structure of various embodiments, and not as a complete description of all the elements and features of apparatus and systems that might make use of the structures described herein.

The novel apparatus and systems of various embodiments may comprise and/or be included in electronic circuitry used in high-speed computers, communication and signal processing circuitry, single or multi-processor modules, single or multiple embedded processors, multi-core processors, data switches, and application-specific modules including multi-layer, multi-chip modules. Such apparatus and systems may further be included as sub-components within a variety of electronic systems, such as televisions, cellular telephones, personal computers (e.g., laptop computers, desktop computers, handheld computers, tablet computers, etc.), workstations, radios, video players, audio players (e.g., MP3 (Motion Picture Experts Group, Audio Layer 3) players), vehicles, medical devices (e.g., heart monitor, blood pressure monitor, etc.), set top boxes, and others. Some embodiments may include a number of methods.

Figure 4:
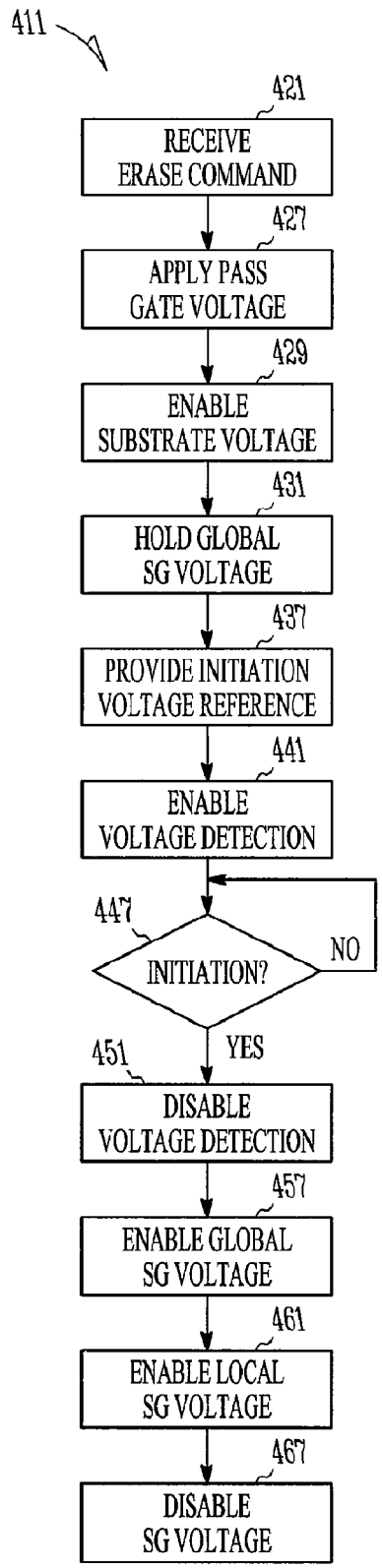
FIG. 4 is a flow diagram illustrating several methods according to various embodiments of the invention.

FIG. 4 is a flow diagram illustrating several methods 411 according to various embodiments of the invention. The methods 411 may be accomplished using the apparatus and systems shown in FIGS. 1-3, among others. In some embodiments, a method 411 may commence with receiving an external erase command at block 421, perhaps at a control circuit coupled to an erasable memory array located on a substrate. The method 411 may include applying a pass gate voltage to at least one pass gate coupled to a plurality of wordline transistors coupled to a memory array, such as an erasable memory array. Thus, the pass gate voltage may be enabled after the external erase command is received, at block 427. Responsive to receiving the external erase command, application of a voltage to the substrate may be enabled at block 429.

In some embodiments, the method 411 may include holding a global select gate voltage to approximately zero volts, at block 431, until a preselected initiation voltage level is detected with respect to a voltage applied to the substrate, such as the ramping substrate voltage $V_{ISO-PWELL}$ (see block 447). The global select gate voltage may also be held at some other voltage (less than the ultimate value it is permitted to reach) until the preselected initiation voltage level is detected. An erase initiation circuit, described above, may be used to control the application of the global select gate voltage.

In some embodiments, the method 411 may include, at block 437, providing the preselected initiation voltage level as a reference voltage between about zero volts and about ten volts, including about 3.7 volts, perhaps using a substantially constant voltage reference. The preselected initiation voltage level may also be selected as some voltage less than about one-third of the ultimate level of the substrate voltage $V_{ISO-PWELL}$. The method may include, at block 441, enabling a voltage detection circuit to detect the voltage applied to the substrate, responsive to receiving the external erase command. This activity may include, in turn, determining that the voltage applied to the substrate has risen from approximately zero volts.

If it is determined that the voltage $V_{ISO-PWELL}$ applied to the substrate has not reached the preselected initiation voltage level at block 447, then the method 411 may include continuing to wait for the preselected initiation voltage $V_I$ to be reached. If it is determined that the voltage $V_{ISO-PWELL}$ applied to the substrate has reached the preselected initiation voltage level at block 447, then the method 411 may include disabling the voltage detection circuit, at block 451.

In some embodiments, the method 411 may include enabling application of a global select gate voltage to wordline transistors coupled to the memory array after the voltage applied to the substrate has reached the preselected initiation voltage level (e.g., between about zero volts and an ultimate erase voltage Verase) at block 457. The global select gate voltage may comprise a global select gate-drain GSGD voltage or a global select gate-source GSGS voltage.

In some embodiments, the method 411 may include enabling application of a local select gate voltage coupled to the wordline transistors at about the same time the application of the global select gate voltage is enabled at block 461. The method 411 may conclude with disabling the application of global (and in turn, local) select gate voltages at block 467.

It should be noted that the activities described herein may be executed in an order other than the order described. The various activities described with respect to the methods identified herein may also be executed in repetitive, serial, and/or parallel fashion.

A software program may be launched from a computer-readable medium in a computer-based system to execute functions defined in the software program. Various programming languages may be employed to create software programs designed to implement and perform the methods disclosed herein. The programs may be structured in an object-oriented format using an object-oriented language such as Java or C++. Alternatively, the programs may be structured in a procedure-oriented format using a procedural language, such as assembly or C. The software components may communicate using a number of mechanisms well known to those of ordinary skill in the art, such as application program interfaces or inter-process communication techniques, including remote procedure calls. The teachings of various embodiments are not limited to any particular programming language or environment. Thus, other embodiments may be realized.

For example, an article of manufacture, such as a computer, a memory system, a magnetic or optical disk, some other storage device, and/or any type of electronic device or system may include a processor coupled to a machine-accessible medium such as a memory (including the memory array 210 of FIG. 2) having associated information (e.g., computer program instructions and/or data), which, when accessed, results in a machine (e.g., the processor) performing any of the activities described herein with respect to the methods shown in FIG. 4.

The apparatus, systems, and methods disclosed herein may operate to reduce the stress on memory array components, including NAND flash memory array components, that can occur during erase operations. Increased device reliability, and operational lifetime, may result.

The accompanying drawings that form a part hereof show, by way of illustration and not of limitation, specific embodiments in which the subject matter may be practiced. The embodiments illustrated are described in sufficient detail to enable those skilled in the art to practice the teachings disclosed herein. Other embodiments may be utilized and derived therefrom, such that structural and logical substitutions and changes may be made without departing from the scope of this disclosure. This Detailed Description, therefore, is not to be taken in a limiting sense, and the scope of various embodiments is defined only by the appended claims and the full range of equivalents to which such claims are entitled.

Such embodiments of the inventive subject matter may be referred to herein individually or collectively by the term "invention" merely for convenience and without intending to voluntarily limit the scope of this application to any single invention or inventive concept, if more than one is in fact disclosed. Thus, although specific embodiments have been illustrated and described herein, any arrangement calculated to achieve the same purpose may be substituted for the specific embodiments shown. This disclosure is intended to cover any and all adaptations or variations of various embodiments. Combinations of the above embodiments and other embodiments not specifically described herein will be apparent to those of skill in the art upon reviewing the above description.

The Abstract of the Disclosure is provided to comply with 37 C.F.R. §1.72(b) requiring an abstract that will allow the reader to quickly ascertain the nature of the technical disclosure. It is submitted with the understanding that it will not be used to interpret or limit the scope or meaning of the claims. In the foregoing Detailed Description, various features are grouped together in a single embodiment for the purpose of streamlining the disclosure. This method of disclosure is not to be interpreted to require more features than are expressly recited in each claim. Rather, inventive subject matter may be found in less than all features of a single disclosed embodiment. Thus the following claims are hereby incorporated into the Detailed Description, with each claim standing on its own as a separate embodiment.

What is claimed is:

1. An apparatus, comprising:
   an erasable memory array; and
   an erase initiation circuit coupled to the erasable memory array and configured to apply a global select gate voltage to wordline transistors coupled to the erasable memory array after an initiation voltage has reached a preselected value that is less than an ultimate erase voltage.

2. The apparatus of claim 1, further comprising a voltage detection circuit configured to detect the initiation voltage.

3. The apparatus of claim 2, wherein the voltage detection circuit is configured to be activated when the initiation voltage increases, and to be de-activated after the preselected value is detected.

4. The apparatus of claim 1, further comprising a substrate that supports at least the erasable memory array and the erase initiation circuit.

5. The apparatus of claim 4, wherein the initiation voltage comprises a voltage applied to the substrate.

6. The apparatus of claim 1, wherein the initiation voltage ranges between approximately three and approximately four volts.

7. The apparatus of claim 1, wherein the erasable memory array comprises a plurality of floating gate transistors.

8. An apparatus, comprising:
   an erasable memory array having a plurality of wordline transistors;
   an erase initiation circuit coupled to the erasable memory array that is configured to provide a global select gate voltage to the wordline transistors after an initiation voltage has reached a preselected initiation level that is less than an ultimate erase voltage; and
   a control circuit coupled to the erasable memory array and configured to receive an external erase command.

9. The apparatus of claim 8, wherein the control circuit is coupled to the erasable memory array by a decoder circuit.

10. The apparatus of claim 8, further comprising a voltage detection circuit configured to detect the initiation voltage.

11. The apparatus of claim 10, wherein at least one of the erase initiation circuit and the voltage detection circuit form a portion of the control circuit.

12. The apparatus of claim 10, wherein the control circuit comprises a state machine configured to indicate an erase mode, further wherein the voltage detection circuit is activated based upon the indication.

13. The apparatus of claim 12, wherein the state machine is configured to generate one of a flag or a logic signal to indicate the erase mode.

14. The apparatus of claim 10, further comprising a substrate supporting at least the erasable memory array, wherein the voltage detection circuit is configured to detect a substrate voltage corresponding to the initiation voltage.

15. The apparatus of claim 8, wherein the erasable memory array comprises a plurality of floating gate transistors.

16. A method, comprising:
   communicating an erase command to an erasable memory array; and
   applying a global select gate voltage to wordline transistors coupled to the erasable memory array after an initiation voltage has reached a preselected initiation level that is less than an ultimate erase voltage.

17. The method of claim 16, wherein communicating an erase command comprises providing an external erase command to the erasable memory array.

18. The method of claim 17, wherein providing an external erase command comprises providing the external erase command to a control circuit coupled to the erasable memory array.

19. The method of claim 16, wherein applying a global select gate voltage comprises applying the initiation voltage to a substrate supporting the erasable memory array.

20. The method of claim 16, wherein communicating an erase command comprises communicating the erase command to a plurality of floating gate transistors.

* * * * *